United States Patent
Kim (12) 
(10) Patent No.: US 6,504,882 B1
(45) Date of Patent: Jan. 7, 2003

(54) ADD-COMPARE-SELECT CIRCUIT FOR VITERBI DECODER

(75) Inventor: Yong-Chan Kim, Kyunggi-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/397,756

(22) Filed: Sep. 16, 1999

(30) Foreign Application Priority Data

Sep. 25, 1998 (KR) .............................. 98-39970

(51) Int. Cl.$^7$ .............................. H03D 1/00; H04L 27/06
(52) U.S. Cl. .................. 375/341; 375/262; 375/265; 714/790; 714/795; 714/796
(58) Field of Search ................. 375/341, 262, 375/265; 714/790, 792, 794, 795, 796

(56) References Cited

U.S. PATENT DOCUMENTS

| | | | | |
|---|---|---|---|---|
| 5,987,637 A | * | 11/1999 | Thomas | 714/795 |
| 5,991,343 A | * | 11/1999 | Oh et al. | 375/341 |
| 6,154,871 A | * | 11/2000 | Claydon et al. | 714/795 |
| 6,343,103 B1 | * | 1/2002 | Lou et al. | 375/261 |
| 6,452,984 B1 | * | 9/2002 | Banister et al. | 375/341 |

* cited by examiner

*Primary Examiner*—Mohammad H. Ghayour
(74) *Attorney, Agent, or Firm*—F. Chau & Associates, LLP

(57) ABSTRACT

There is provided a viterbi decoder for decoding convolutional data. The convolutional data includes punctured data and non punctured data. The decoder includes a branch metric unit for calculating branch metrics of the received convolutional data. An add-compare-select unit selects current and next path selection information and calculates a current state metric and a next state metric of the punctured data, from the branch metrics and a previous state metric. A traceback unit traces the current and the next path selection information selected in the add-compare-select unit to find a maximum likelihood path from which the convolutional data was received, and outputs decoded data. A controller generates a plurality of decoding control signals to the branch metric unit, the add-compare-select unit, and the traceback unit.

15 Claims, 7 Drawing Sheets

ADD-COMPARE-SELECT CIRCUIT FOR VITERBI DECODER

FIELD OF THE INVENTION

The present invention relates to a viterbi decoder and, more particularly, to a viterbi decoder having a reduced decoding time with respect to encoded convolutional codes.

BACKGROUND OF THE INVENTION

A viterbi decoder uses the well known viterbi algorithm when a received convolutional codeword is to be decoded. The viterbi algorithm depends on maximum likelihood decoding. The Viterbi algorithm compares aplurality of known code sequences with received code sequences, selects the path having the shortest code distance as a maximum likelihood path, and obtains decoded data corresponding to the selected path. The viterbi algorithm exhibits excellent error correction capability. Thus, it is widely used in satellite, ground network, and mobile communications.

The principles of viterbi decoding are described, for example, in "CDMA Principles of Spread Spectrum Communication" by A. J. VITERBI, ADDISON-WESLEY PUBLISHING COMPANY, pp.132–138, April, 1995. An example of the viterbi decoder is disclosed in U.S. Pat. No. 5,295,142 issued on Mar. 15, 1994.

In a code division multiple access (CDMA) mobile station, the operational timing of the viterbi decoder relates to three channel types (i.e., sync, paging, and traffic channels) of the four forward CDMA channels. The forward CDMA channel corresponds to communications from a base station (cell) to a mobile station.

In mobile communications, technical requirements are specified by air interface standards such as IS-95A and ANSI J-STD-008. They ensure that mobile stations can obtain service in any cellular system manufactured according to these standards. The IS-95A specification for wideband spread spectrum cellular mobile telephones, supports a 9,600 bps rate family in the three data channeling types (sync, paging, and traffic channels). This is referred to as Rate Set 1. In all cases, the forward error correction (FEC) code rate is ½. The J-STD-008 specification for CDMA personal communications services systems (PCS) supplies, in addition to the above Rate Set 1, a second traffic channel rate family with a maximum rate of 14,400 bps. This is referred to as Rate Set 2. Rate Set 2 uses an FEC code rate of ¾, created by puncturing (deleting) the code used in Rate Set 1.

Rate Set 2 yields the same code symbol rate as Rate Set 1 with 3⁄2 times the data rate. Traffic channels carry variable traffic frames of either 1, ½, ¼, or ⅛ times the full rate. The rate variation is accomplished by 1, 2, 4, or 8-way repetition of code symbols.

A system employing the CDMA communication method uses a viterbi decoder that includes a single add-compare-select (ACS) unit. The decoder usually uses a convolutional codeword with a constrained length K of 9 and, thus, the number of states is $2^{9-1}$, namely, 256. Therefore, the single ACS unit performs addition, comparison, and selection on 256 states for one symbol.

Figure 1:
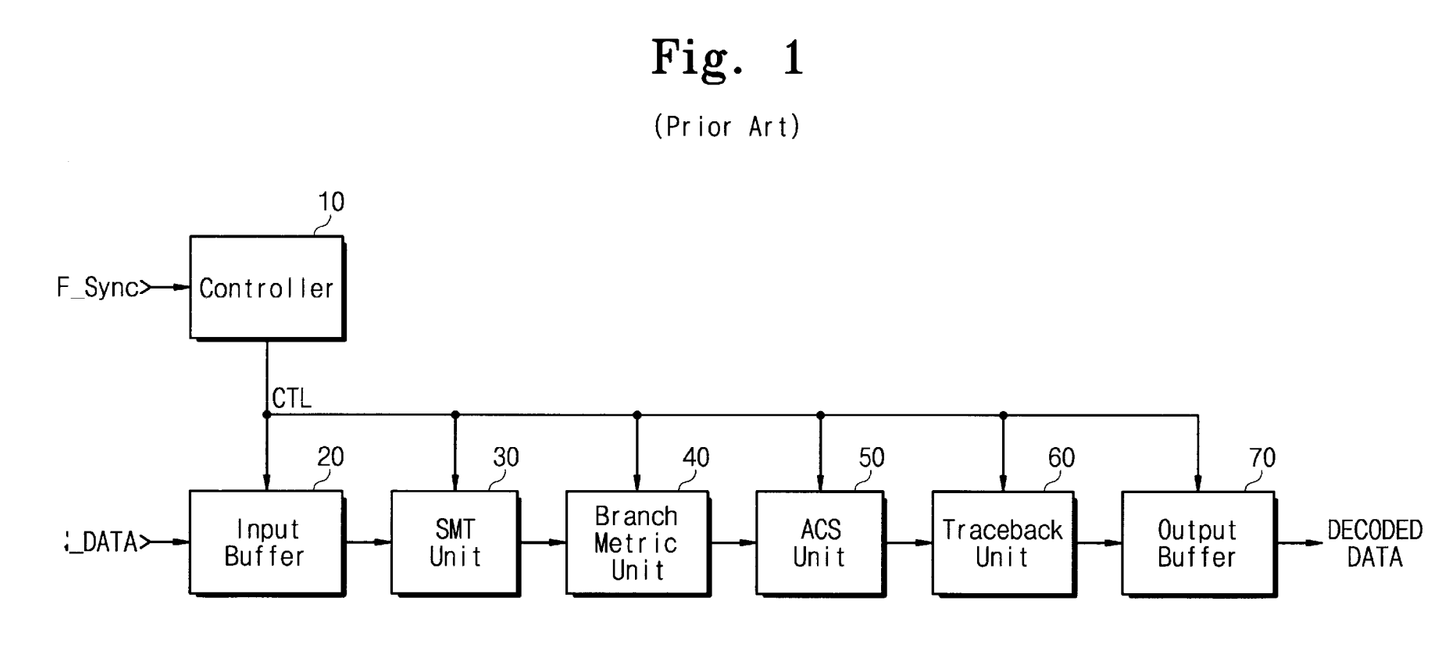
FIG. 1 is a schematic block diagram of a conventional viterbi decoder.

FIG. 1 is a schematic block diagram of a conventional viterbi decoder. The viterbi decoder includes a controller 10, an input buffer 20, a symbol metric table (SMT) unit 30, a branch metric calculate unit 40, an ACS unit 50, a traceback unit 60, and an output buffer 70. The controller 10 generates a variety of control signals (hereinafter collectively represented by the reference symbol "CTL") after a frame synchronous signal F_Sync is activated. The viterbi decoder decodes an input symbol IN_DATA and outputs decoded data DECODED DATA under the control of the control signals CTL from the controller 10.

Figure 2:
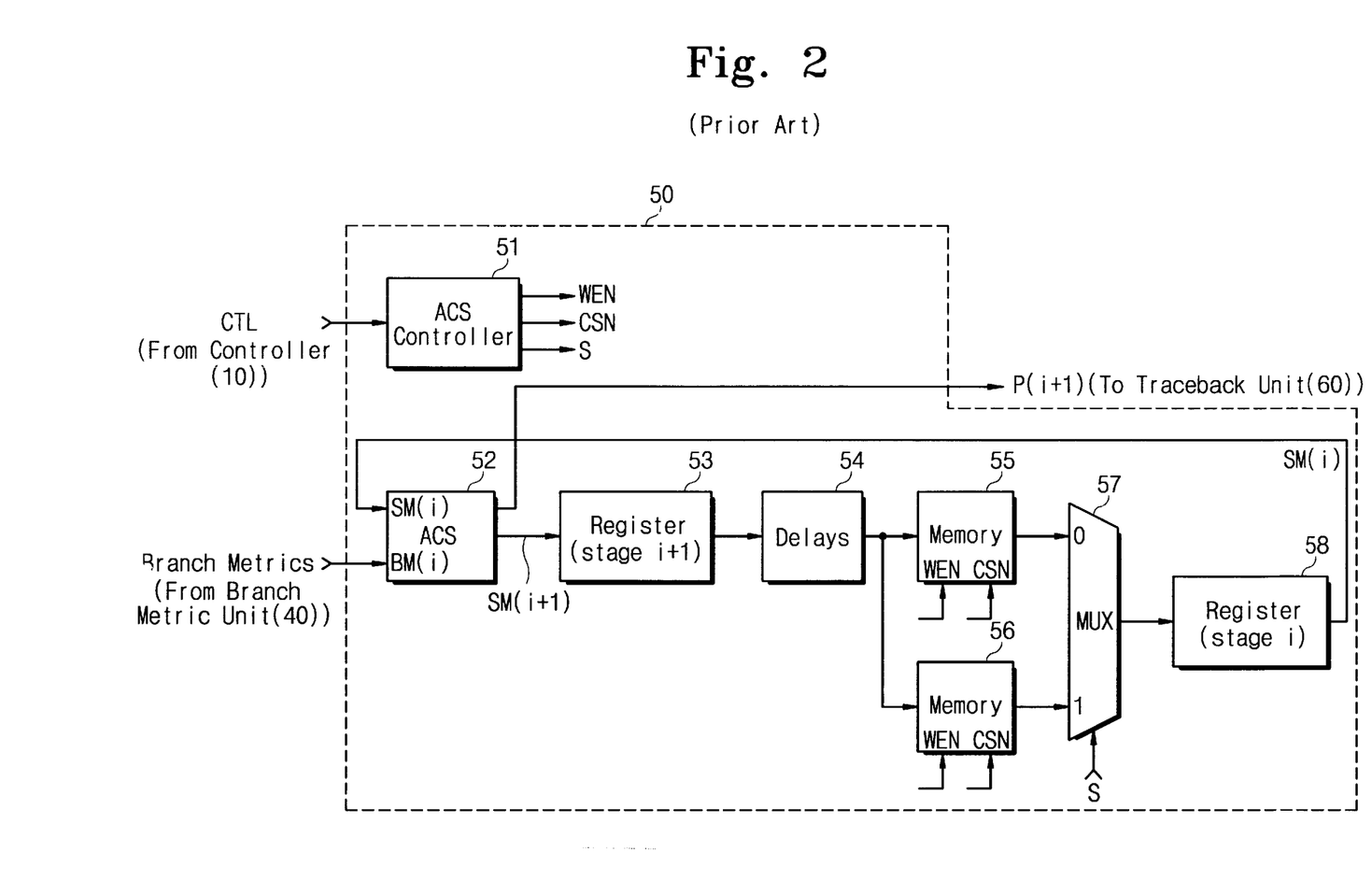
FIG. 2 is a block diagram illustrating an ACS unit shown in FIG. 1.

FIG. 2 is a block diagram illustrating the ACS unit 50 of FIG. 1. The ACS unit 50 includes an ACS controller 51, an ACS calculating unit 52, a first register 53, delays 54, first and second memories 55 and 56, a multiplexer 57, and a second register 58.

The first and the second memories 55 and 56 are random access memories (RAMs) for storing state metrics. Each state metric includes 5 bits and 1 quality bit. The first and the second memories 55 and 56 can store 128*12 bits, respectively.

The first register 53 is used for storing a current state metric SM(i+1) from the ACS calculating unit 52. The second register 58 is used for storing a previous state metric SM(i) from the multiplexer 57.

The ACS controller 51 generates a write enable signal WEN, an access control signal CSN, and a selection signal S in response to the control signals CTL from the controller 10. The write enable signal WEN and the access control signal CSN are supplied to the first and the second memories 55 and 56 to write and access the state metrics, respectively. The multiplexer 57 outputs the previous state metric SM(i) stored in the first memory 55 or the second memory 56 to the register 58 in response to the selection signal S. The ACS calculating unit 52 has an adder for adding the state metric SM(i) and branch metric BM(i) to obtain new state metric SM(i+1), a comparator for comparing the new state metric, and a selector for selecting one of the new state metrics SM(i+1) to be output in response to the output of the comparator.

When the input data IN_DATA is input, the branch metric unit 40 calculates the Euclidean distance or the Hamming distance between the received data and a codeword to be transmitted, and supplies the result of the calculation (i.e., branch metric) to the ACS unit 50. In the ACS calculating unit 52, the branch metric BM(i) is added to previous state metric SM(i) in the adder according to a trellis diagram, currently received state metrics are compared in the comparator, and small state metrics are selected in the selector. The selected state metrics are stored in the memory 55 or 56 as a current state metric SM(i+1). Meanwhile, selected path information P(i+1) of the current state is stored in a path memory (not shown) after passing through the traceback unit 60. The traceback unit 60 traces the path information to look for a state having the largest maximum likelihood, finds the most approximate path to that of data sent from a transmitting encoder (not shown), and outputs decoded data DECODED DATA through the output buffer 70.

Figure 3:
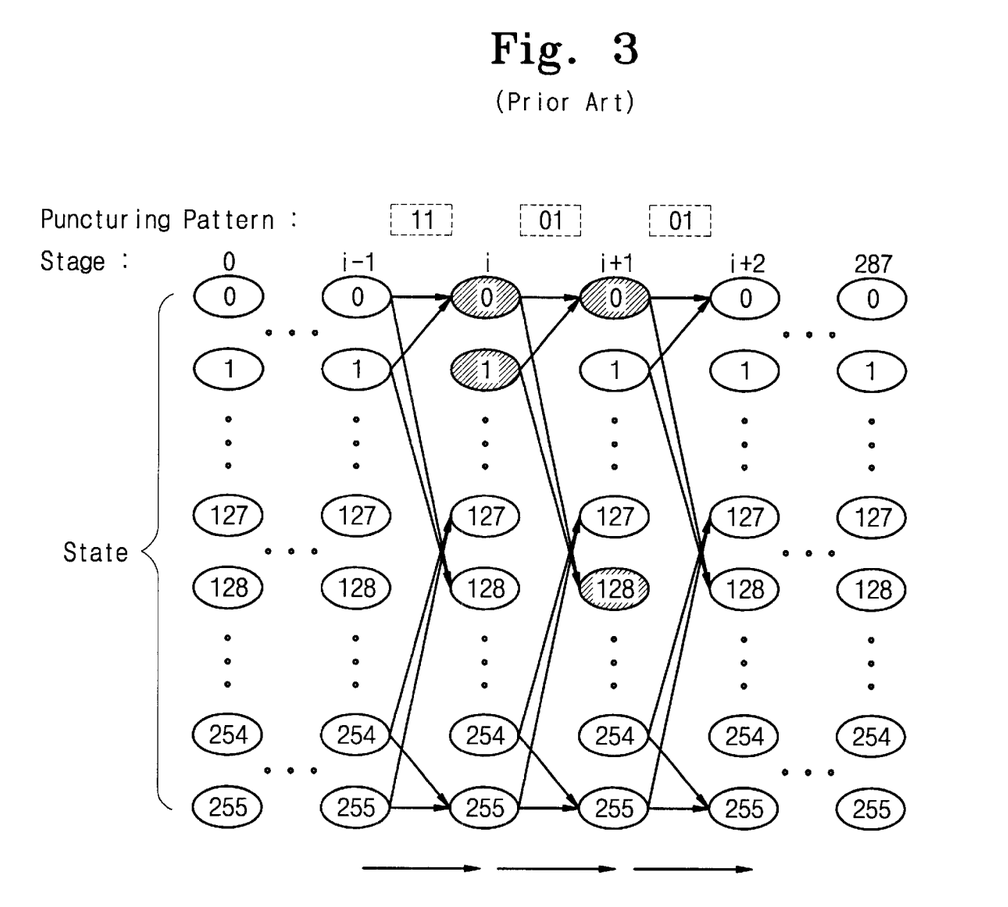
FIG. 3 is a trellis diagram for the conventional ACS unit 50 of FIG. 2, illustrating the allowable transitions from state to state.

FIG. 3 is a trellis diagram illustrating the allowable transitions from state to state for the ACS unit 50 of FIG. 2. The state metric of an 'a' state in the ith stage is expressed as $SM_a^i$, and the branch metric from the 'a' state in the ith stage to a 'b' state in the (i+1) stage is expressed as $BM_{a,b}^i$. In that case, the state metric of the (i+1)th stage is defined as follows:

$$SM_c^{i+1}=\min(SM_a^i+BM_{a,c}^i, SM_b^i+BM_{b,c}^i) \qquad (1)$$

For example, as shown in FIG. 3, the state metric $SM_{128}^{i+1}$ is obtained from the state metrics $SM_0^i$ and $SM_1^i$ and the branch metrics $BM_{0,128}^i$ and $BM_{1,128}^i$. The process of obtaining the current state metric is called ACS calculating, since adding, comparing and selecting are required to determine the current state metric, as shown in equation (1).

Referring to FIGS. 2 and 3, in the ith stage, the first memory 55 stores the state metrics of 'a' state in the ith stage $SM_a^i$, and the second memory 56 stores the state metrics of 'b' state in the (i+1)th stage $SM_b^{i+1}$.

In the ACS unit 50, the first and the second memories 55 and 56 are initialized at the first stage. After initialization, the state metric SM(i) is read from the first memory 55 to calculate the current state metric SM(i+1). The calculated current state metric SM(i+1) is stored in the second memory 56. Reading and writing periods of the first and the second memories 55 and 56 are repeated every other stage. Each of the memories 55 and 56 spends 2 clock cycles for the reading/writing operation. Thus, (256+α) clock cycles are needed for 1 stage processing, wherein α is a delay time of the ACS calculating unit 52.

For example, in the ith stage, the ACS unit 50 calculates $SM_0^{i+1}$ and $SM_{128}^{i+1}$ by reading the state metrics $SM_0^i$ and $SM_1^i$, and calculates $SM_1^{i+1}$ and $SM_{129}^{i+1}$ by reading the state metrics $SM_2^i$ and $SM_3^i$. The calculated state metrics $SM_0^{i+1}$ and $SM_1^{i+1}$ are stored in the second memory 56, when the state metrics $SM_4^i$ and $SM_5^i$ are read out from the first memory 55. The state metrics $SM_{128}^{i+1}$ and $SM_{129}^{i+1}$ are stored in the second memory 56, when the state metrics $SM_6^i$ and $SM_7^i$ are read out from the first memory 55. The ACS calculating process of the ith stage is not terminated until it is applied to all states of the ith stage. Thus, the ACS calculating time depends upon the frame size. Since the frame size of Rate Set 2 is approximately 1.5 times as large as Rate Set 1, the ACS calculating time of Rate Set 2 is longer than that of Rate Set 1.

In ACS calculating, despite being accumulated in the state metrics, normalization and saturation processes are executed every stage to prevent overflow of the state memories 55 and 56, since the state metrics are only 5 bits. Thus, in the ACS unit 50 having the single ACS calculating unit 52, ACS calculating of the three stages requires three steps to process the puncturing pattern '110101'. In that case, the current state metric SM(i+1), considering the normalization and saturation processes, is expressed as follows:

$$SM_c^{i+1} = \min(SM_a^i - mS + BM_{a,c}^i, SM_b^i - mS + BM_{b,c}^i, 31) \qquad (2)$$

$$mS = \min_{k=0,255}(SM_k^i)$$

Figure 4:
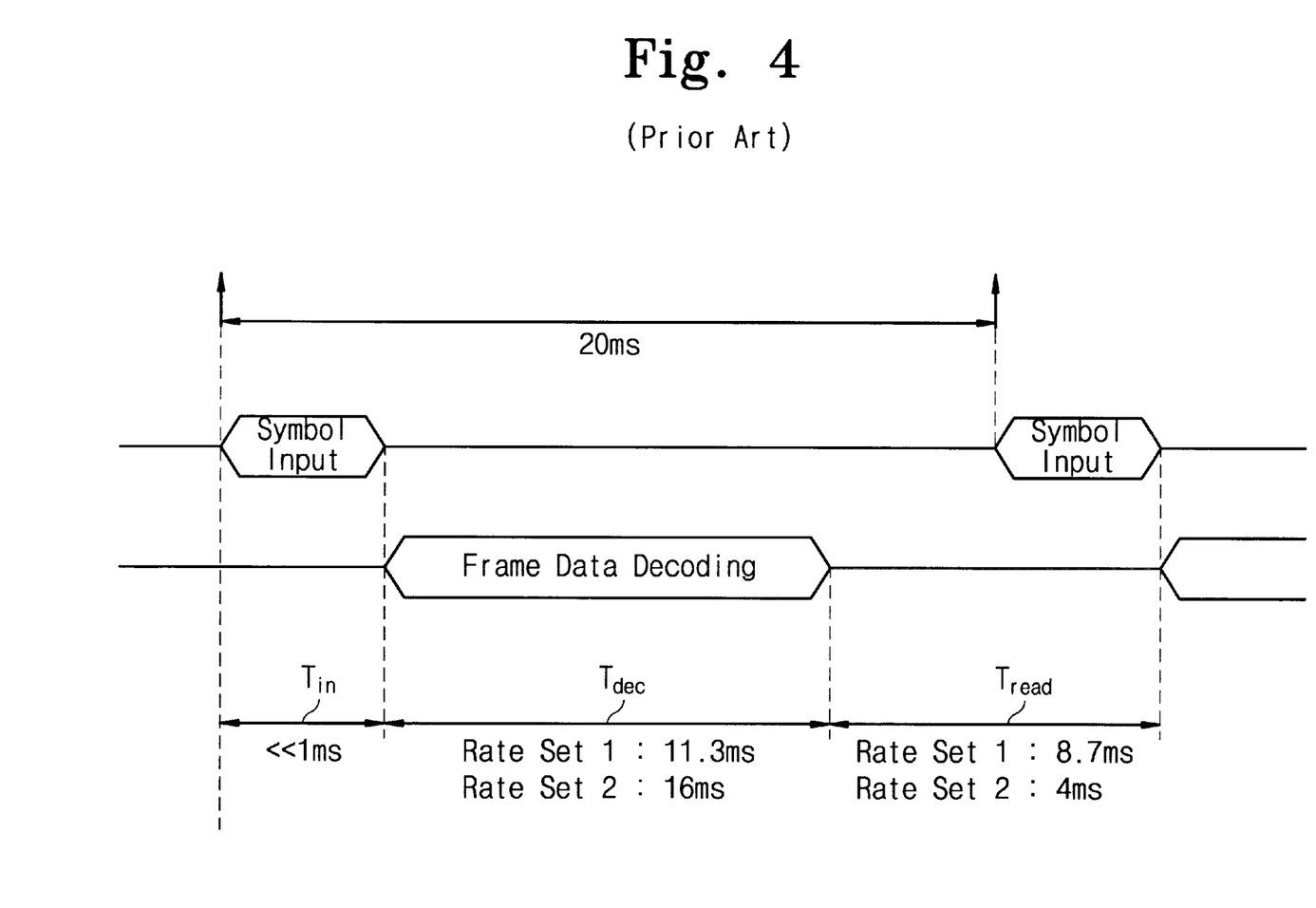
FIG. 4 is a timing diagram illustrating the operation of the conventional viterbi decoder in the forward traffic channel.

FIG. 4 is a timing diagram illustrating the operation of the conventional viterbi decoder in the forward traffic channel. In the forward traffic channel, the period for one frame is 20 ms. Thus, the frame synchronous signal F_Sync is generated every 20 ms. When the frame synchronous signal F_Sync is activated, the viterbi decoder performs the decoding process after inputting the frame data therein. The frame data input time $T_{in}$ for inputting the frame data is much less than 1 ms. After the frame data decoding process, the decoded data is read by a central processing unit (CPU) (not shown) before the start of the next frame decoding process. The frame data decoding time $T_{dec}$ is approximately 11.3 ms in Rate Set 1, and approximately 16 ms in Rate Set 2. A time for reading the decoded frame data, i.e., a frame data reading time $T_{read}$ is measured about 8.7 ms in the Rate Set 1, and 4 ms in the Rate Set 2, respectively. The frame data reading time $T_{read}$ is defined as follows:

$$T_{read} = 20 \text{ ms} - T_{dec} \qquad (3)$$

As shown in equation (3), the frame data reading time $T_{read}$ depends upon the frame data decoding time $T_{dec}$. The frame data reading time $T_{read}$ decreases as the frame data decoding time $T_{dec}$ increases. Thus, it is possible that the CPU cannot read the decoded frame data correctly if the frame data reading time $T_{read}$ is shortened. As described above, the frame data reading time $T_{read}$ in the Rate Set 1 is approximately 8.7 ms, so that the frame data reading time $T_{read}$ is sufficient to correctly read the frame data. The frame data reading time $T_{read}$ in Rate Set 2 is approximately 4 ms. In that case, it is possible that the frame data is not able to be read correctly during the frame data reading time $T_{read}$. Thus, there is a need to reduce the decoding time of the viterbi decoder in Rate Set 2.

SUMMARY OF THE INVENTION

The present invention is directed to a viterbi decoder having a reduced decoding time of encoded convolutional codes.

According to an aspect of the present invention, there is provided a viterbi decoder for decoding convolutional data. The convolutional data includes punctured data and non punctured data. The decoder includes a branch metric unit for calculating branch metrics of the received convolutional data. An add-compare-select unit selects current and next path selection information and calculates a current state metric and a next state metric of the punctured data, from the branch metrics and a previous state metric. A traceback unit traces the current and the next path selection information selected in the add-compare-select unit to find a maximum likelihood path from which the convolutional data was received, and outputs decoded data. A controller generates a plurality of decoding control signals to the branch metric unit, the add-compare-select unit, and the traceback unit.

According to another aspect of the present invention, the add-compare-select unit includes an add-compare-select control device for generating a write enable signal, an access control signal, and a selection signal, in response to a plurality of control signals from the controller including a puncturing stage control signal. A first and a second storing device store the current state metric or the next state metric in response to the write enable signal, and read out the previous state metric stored therein in response to the access control signal. A first selection device outputs the current state metric or the next state metric to the storing device in response to the puncturing stage control signal. A register stores the previous state metric outputted from the first selection device. A first add-compare-select calculating device adds, compares, and selects the branch metrics and the previous state metric from the register, and generates the current state metric and the current path selection information. A second add-compare-select calculating device adds, compares, and selects the next branch metric and the current state metric from the first add-compare-select calculating device, and generates the next state metric and the next path selection information. A second selection device outputs the previous state metric in response to the selection signal.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF PREFERRED EMBODIMENTS

In a forward code division multiple access (CDMA) channel, a traffic channel carries data in 20 ms frames. Frames at the higher rates of Rate Set 1, and in all frames of Rate Set 2, include CRC codes to help assess the frame quality in a receiver. The traffic channels carry variable rate traffic frames, that being either 1, ½, ¼, or ⅛ of a full rate. In IS-95A only 9,600 bps rate family is currently available. In J-STD-008, a second rate set (i.e., Rate Set 2) based on a full rate of 14,400 bps is available. The rate variation is accomplished by 1, 2, 4, or 8-way repetition of code symbols. Transmission is continuous, with the amplitude reduced at the lower rates to keep the energy per bit approximately constant, regardless of rate. The rate is independently variable in each 20 ms frame.

Before transmission in Rate Set 2, certain symbols are punctured (or deleted) and not transmitted. Two out of the six bits are deleted in a repeating pattern. Thus, for every six information bits to be transmitted, only four encoded bits are actually transmitted. In that case, the encoded bit pattern is expressed as '110101', wherein '0' denotes a punctured (deleted) symbol.

In the viterbi decoder, the branch metric corresponding to the symbol of '0' is '0'. Thus, an overflow of the state metric is not occurred in spite of simultaneous calculating of the pattern '0101'. Therefore, according to the present invention, an add-compare-select (ACS) unit has ACS calculating units for simultaneous calculating of the puncturing pattern in the full rate (i.e., 14,400 bps) of Rate Set 2.

Figure 5:
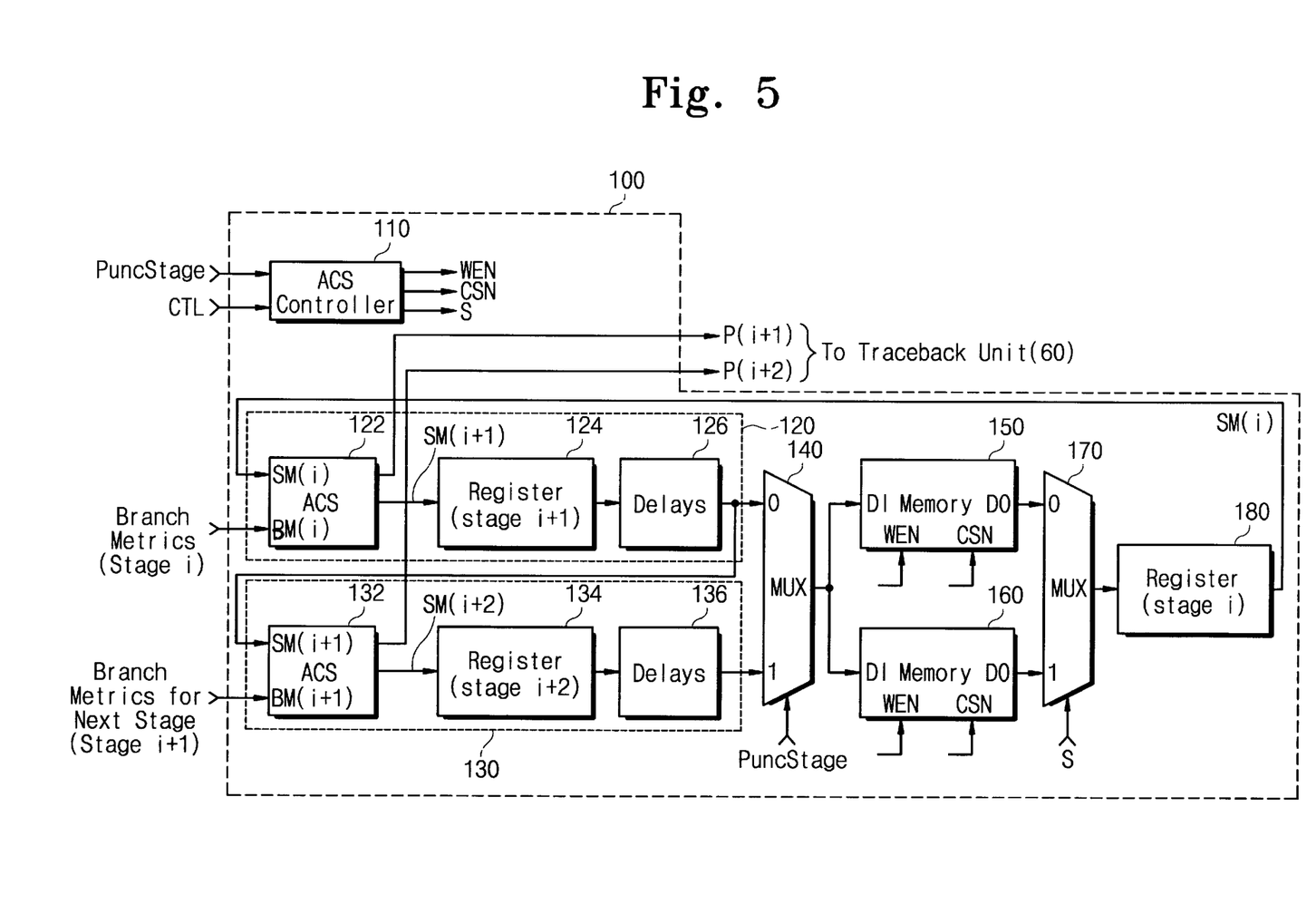
FIG. 5 is a block diagram illustrating an ACS unit according to an embodiment of the present invention.

FIG. 5 is a block diagram of an add-compare-select (ACS) unit 100 according to an embodiment of the present invention. The ACS unit 100 includes an ACS controller 110, a first ACS calculating unit 120, a second ACS calculating unit 130, a first multiplexer 140, a first memory 150, a second memory 160, a second multiplexer 170, and a first register 180.

The ACS unit 100 selects path selection information. The path selection information includes current path selection information and next path selection information corresponding to a current survival path and a next survival path, respectively. This is described in further detail hereinbelow.

The ACS controller 110 generates a write enable signal WEN, an access control signal CSN, and a selection signal S in response to a variety of decoding control signals CTL and a puncturing stage control signal PuncStage from a controller (such as the controller 10 shown in FIG. 1). If the puncturing stage control signal PuncStage is logic low level (i.e., '0'), then the ACS unit 100 operates for non punctured symbol such as the symbol of '11'. On the other hand, if the puncturing stage control signal PuncStage is logic high level (i.e., '1'), then the ACS unit 100 operates for punctured symbol such as the symbol of '0101'.

The first ACS calculating unit 120 includes a first ACS calculating circuit 122, a second register 124, and first delays 126. Similarly, the second ACS calculating unit 130 includes a second ACS calculating circuit 132, a third register 134, and second delays 136. The first delays 126 are coupled to the second ACS calculating circuit 132 for supplying/inputting the calculated result from the first ACS calculating circuit 122 to the second ACS calculating circuit 132.

The first ACS calculating unit 120 adds and compares the branch metric BM(i) for the current state and previous state metric SM(i), and selects small state metrics as a current state metric SM(i+1). In addition, the first ACS calculating circuit 122 generates a selected current path information P(i+1) to a traceback unit (such as the traceback unit 60 shown in FIG. 1). The calculated current state metric SM(i+1) is stored in the second register 124 and delayed by the first delays 126 during a predetermined time.

When the puncturing stage control signal PuncStage is '1', that is, when the ACS unit 100 executes ACS calculating of the punctured symbol of '0101', the second ACS calculating unit 130 adds and compares the branch metric BM(i+1) for the next stage and the current state metric SM(i+1) calculated from the first ACS calculating unit 120, and selects small state metrics as a next state metric SM(i+2). In addition, the second ACS calculating circuit 132 generates a selected next path information P(i+2) to the traceback unit (such as the traceback unit 60 shown in FIG. 1). The calculated next state metric SM(i+2) is stored in the third register 134 and delayed by the second delays 136 during the predetermined time.

The first multiplexer 140 selects and outputs the calculated state metrics SM(i+1) or SM(i+2) to the write enabled memory 150 or 160. If the puncturing stage control signal PuncStage is '0', then the first multiplexer 140 outputs the current state metric SM(i+1) to the memory 150 or 160. On the other hand, if the puncturing stage control signal PuncStage is '1', then the first multiplexer 140 outputs the next state metric SM(i+2) to the memory 150 or 160.

The first and the second memories 150 and 160 are random access memories (RAMs) for storing the state metrics. Each state metric includes 5 bits and 1 quality bit. The first and the second memories 150 and 160 can store 128*12 bits, respectively. Reading and writing periods of the first and the second memories 150 and 160 are repeated every other stage. Each word of the state memories 150 and 160 store neighboring state metrics of the same stage such as $SM_0^{i+1}$ and $SM_1^{i+1}$. When the puncturing stage control signal PuncStage is '0', the access control signal CSN and the write enable signal WEN are supplied to the first and the second memories 150 and 160 in order to access the previous state metric SM(i) and write the current state metric SM(i+1), respectively. Similarly, when the puncturing stage control signal PuncStage is '1', the access control signal CSN and the write enable signal WEN are supplied to the first and the second memories 150 and 160 in order to access the previous state metric SM(i) and write the next state metric SM(i+2), respectively.

The second multiplexer 170 supplies the previous state metric SM(i) stored in the first memory 150 or the second memory 160 to the first register 180 in response to the selection signal S. The state metric SM(i) is provided to the first ACS calculating unit 120 through the first register 180 so as to calculate the current state metric SM(i+1).

Figure 6:
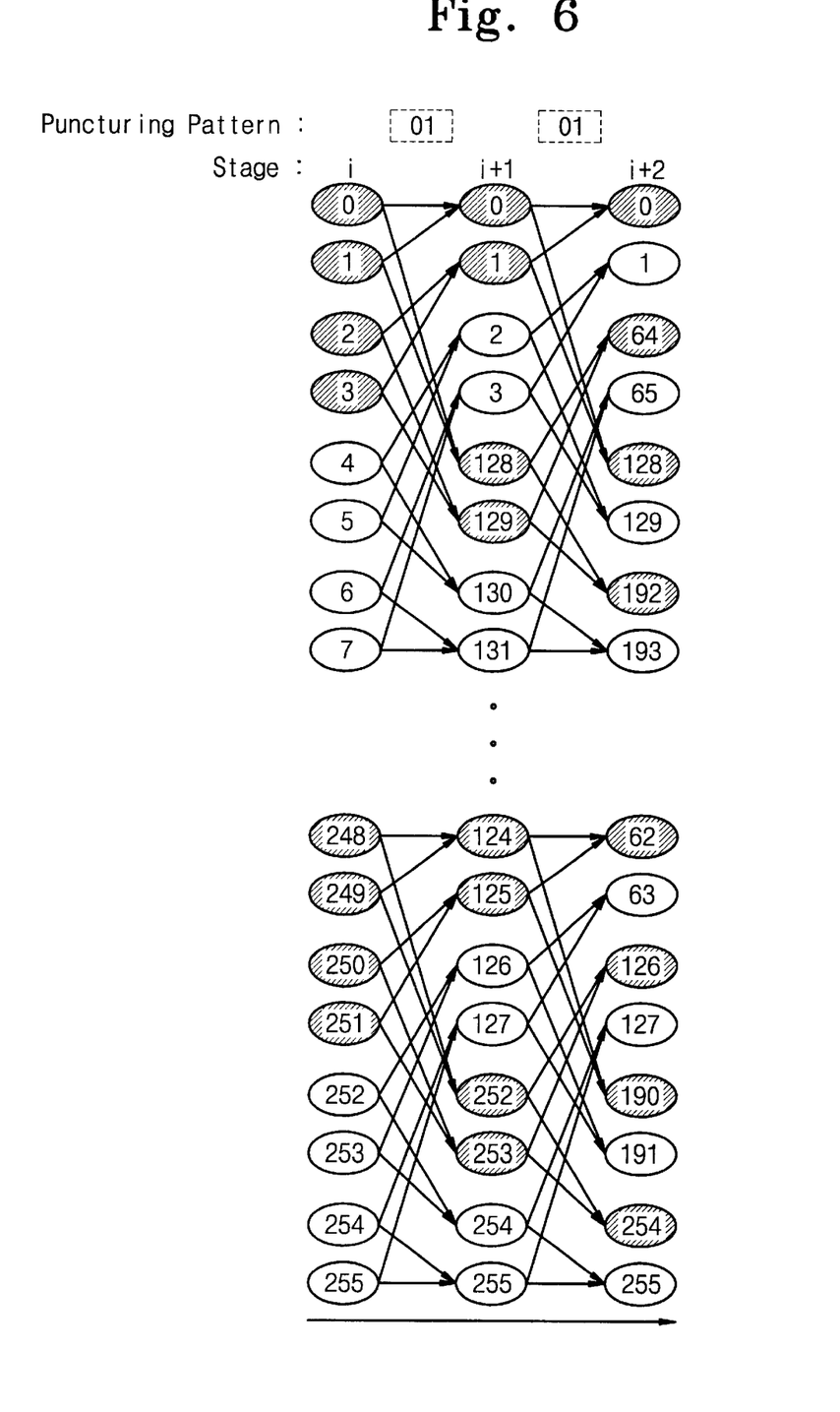
FIG. 6 is a trellis diagram illustrating a viterbi decoding of a punctured pattern '0101' at the full rate of Rate Set 2 according to an embodiment of the present invention.

FIG. 6 is a trellis diagram illustrating a viterbi decoding of the punctured pattern '0101' at the maximum rate (i.e., 14,400 bps) of Rate Set 2 according to an embodiment of the present invention. As described above, the next state metric SM(i+2) of the punctured symbols '0101' are calculated in the ACS unit 100 at one time with the previous state metric SM(i). The calculating steps are described as follows.

First, the previous state metrics SM(i) $SM_0^i$, $SM_1^i$, $SM_2^i$, and $SM_3^i$ corresponding to the states 0, 1, 2, and 3 of the ith stage are read out from the first memory 150 or the second memory 160 and input to the first ACS calculating unit 120. The first ACS calculating unit 120 calculates the current state metrics SM(i+1) $SM_0^{i+1}$, $SM_1^{i+1}$, $SM_{128}^{i+1}$, and $SM_{129}^{i+1}$ from the previous state metrics SM(i) $SM_0^i$, $SM_1^i$, $SM_2^i$, and $SM_3^i$. The calculated current state metrics SM(i+1) $SM_0^{i+1}$, $SM_1^{i+1}$, $SM_{128}^{i+1}$, and $SM_{129}^{i+1}$ are input to the second ACS calculating unit 130. The second ACS calculating unit 130 calculates the next state metrics SM(i+2) $SM_0^{i+2}$, $SM_{64}^{i+2}$, $SM_{128}^{i+2}$, and $SM_{192}^{i+2}$ from the current state metrics SM(i+1) $SM_0^{i+1}$, $SM_1^{i+1}$, $SM_{128}^{i+1}$, and $SM_{129}^{i+1}$.

As described above, the memories 150 and 160 store the neighboring state metrics of the same stage, so that the ACS calculating units 120 and 130 calculate the neighboring state metrics for storing the calculated state metrics. Thus, in addition, the previous state metrics SM(i) $SM_4^i$, $SM_5^i$, $SM_6^i$, and $SM_7^i$ corresponding to the states 4, 5, 6, and 7 of the ith stage are read out from the first memory 150 or the second memory 160 and input to the first ACS calculating unit 120. The first ACS calculating unit 120 calculates the current state metrics SM(i+1) $SM_2^{i+1}$, $SM_3^{i+1}$, $SM_{130}^{i+1}$ and $SM_{131}^{i+1}$ from the previous state metrics SM(i) $SM_4^i$, $SM_5^i$, $SM_6^i$, and $SM_7^i$. The calculated current state metrics SM(i+1) $SM_2^{i+1}$, $SM_3^{i+1}$, $SM_{130}^{i+1}$, and $SM_{131}^{i+1}$ are input to the second ACS calculating unit 130. The second ACS calculating unit 130 calculates the next state metrics SM(i+2) $SM_1^{i+2}$, $SM_{65}^{i+2}$, $SM_{129}^{i+2}$, and $SM_{193}^{i+2}$ from the current state metrics SM(i+1) $SM_2^{i+1}$, $SM_3^{i+1}$, $SM_{130}^{i+1}$, and $SM_{131}^{i+1}$.

After ACS calculating of the neighboring state metrics, the calculated next state metrics SM(i+2) $SM_0^{i+2}$ and $SM_1^{i+2}$, $SM_{64}^{i+2}$ and $SM_{65}^{i+2}$ $SM_{129}^{i+2}$ and $SM_{129}^{i+2}$, and $SM_{192}^{i+2}$ and $SM_{193}^{i+2}$ are stored in the memories 150 and 160. They correspond to 0, 1, 64, 65, 128, 129, 192, and 193 of the states of the (i+2)th stage.

Figure 7:
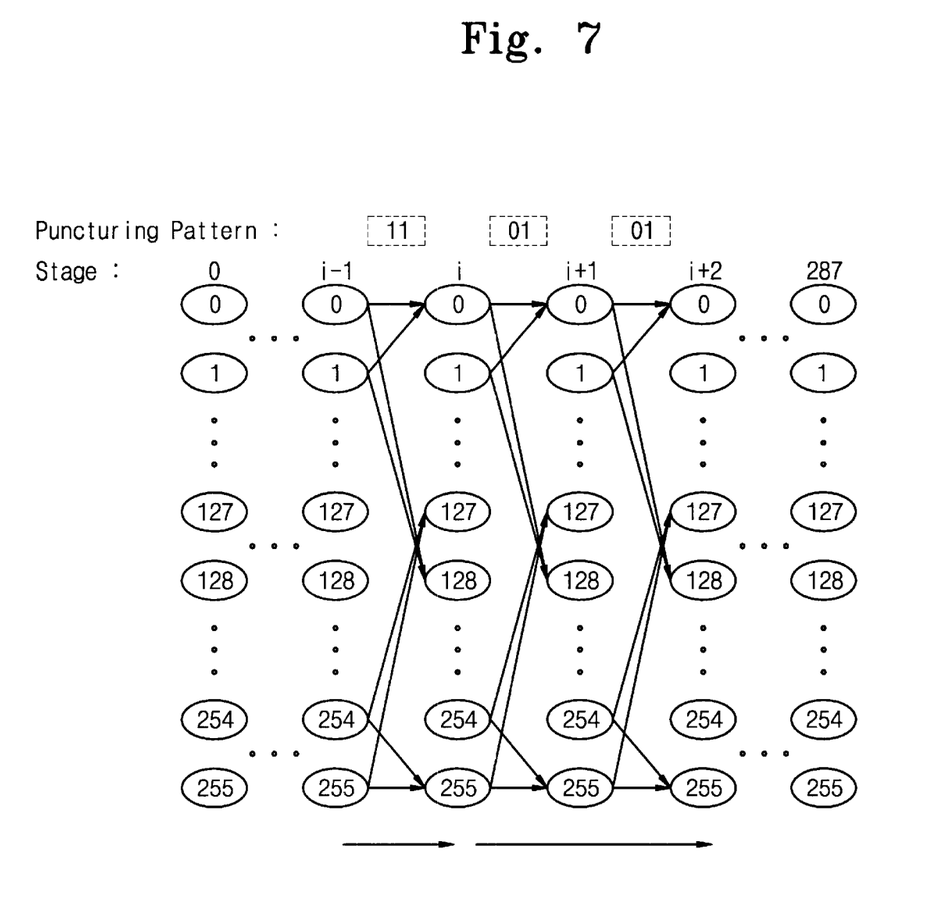
FIG. 7 is a trellis diagram illustrating a viterbi decoding of puncturing patterns using a ¾ code rate of the maximum rate of Rate Set 2 according to an embodiment of the present invention.

FIG. 7 is a trellis diagram illustrating a viterbi decoding of puncturing patterns using a ¾ code rate of the maximum rate (i.e., 14,400 bps) of Rate Set 2 according to an embodiment of the present invention. The state metrics of the pattern '11' of the puncturing pattern '110101' are calculated by only one ACS calculating circuit (i.e., the first ACS calculating unit 120). The non punctured patterns are also calculated by the first ACS calculating unit 120, since the state memory is able to overflow.

Otherwise, the state metrics of the pattern '0101' of the puncturing pattern '110101' are simultaneously calculated by the first and the second ACS calculating units 120 and 130, since the overflow of the state metric is not occurred by the characteristic of the puncturing patterns of Rate Set 2.

As a result, as shown in FIG. 7, the number of steps of ACS calculating for the puncturing pattern '110101' can be reduced from three steps to two steps. Thus, the ACS calculating time is reduced by ⅔ times.

Furthermore, as shown in FIG. 4, when a traceback length $L_{Tr}$ is 64, the decoding time of one frame is approximately 16 ms at the maximum rate of Rate Set 2. Otherwise, according to an embodiment of the present invention, the decoding time of one frame is approximately 14.4 ms at the maximum rate of Rate Set 2 although the traceback length $L_{Tr}$ is 96.

Thus, by reducing the decoding time in a viterbi decoder, the present invention advantageously allows for a central processing unit (CPU) to correctly read decoded frame data during the data reading time of the CPU.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A viterbi decoder for decoding convolutional data, the convolutional data comprising punctured data and non punctured data, the decoder comprising:

a branch metric unit for calculating branch metrics of the received convolutional data;

an add-compare-select unit for selecting current and next path selection information and calculating a current state metric and a next state metric of the punctured data, from the branch metrics and a previous state metric;

a traceback unit for tracing the current and the next path selection information selected in the add-compare-select unit to find a maximum likelihood path from which the convolutional data was received, and outputting decoded data; and a controller for generating a plurality of decoding control signals to the branch metric unit, the add-compare-select unit, and the traceback unit.

2. The viterbi decoder according to claim 1, wherein said add-compare-select unit comprises:

add-compare-select control means for generating a write enable signal, an access control signal, and a selection signal, in response to a plurality of control signals from the controller including a puncturing stage control signal;

first and a second storing means for storing one of the current state metric and the next state metric in response to the write enable signal, and reading out the previous state metric stored therein in response to the access control signal;

first selection means for outputting one of the current state metric and the next state metric to the storing means in response to the puncturing stage control signal;

register for storing the previous state metric outputted from the first selection means;

first add-compare-select calculating means for adding, comparing, and selecting the branch metrics and the previous state metric from the register, and generating the current state metric and the current path selection information;

second add-compare-select calculating means for adding, comparing, and selecting the next branch metric and the current state metric from the first add-compare-select calculating means, and generating the next state metric and the next path selection information; and second selection means for outputting the previous state metric in response to the selection signal.

3. The viterbi decoder according to claim 2, wherein said first add-compares elect calculating means comprises:

a first add-compare-select calculating circuit for performing addition, comparison, and selection functions so as to generate the current state metrics and the current path selection information;

a register for storing the current state metric; and a delay for delaying the current state metric a predetermined time and then supplying the current state metric to the second selection means.

4. The viterbi decoder according to claim 2, wherein said second add-compares elect calculating means comprises:

a second add-compare-select calculating circuit for performing addition, comparison, and selection functions so as to generate the next state metric and the next path selection information;

a register for storing the next state metric; and a delay for delaying the next state metric a predetermined time and then supplying the next state metric to the second selection means.

5. The viterbi decoder according to claim 2, wherein said second add-compare-select calculating means generates the current state metric and the current path selection information, when the convolutional data is non punctured data, and generates the next state metric and the next path selection information, when the convolutional data is punctured data.

6. The viterbi decoder according to claim 2, wherein said second add-compare-select calculating means generates the current state metric and the current path selection information or the next state metric and the next path selection information, in response to the puncturing stage control signal from the controller.

7. The viterbi decoder according to claim 1, wherein the current and next path selection information comprise a current survival path and a next survival path, respectively.

8. The viterbi decoder according to claim 1, wherein the current state metric and the next state metric are calculated by the add-compare-select unit approximately simultaneously.

9. A viterbi decoder for decoding convolutional data, the convolutional data comprising punctured data and non punctured data, the decoder comprising:

a branch metric unit for calculating branch metrics of the received convolutional data;

add-compare-select control means for generating a write enable signal, an access control signal, and a selection signal, in response to a plurality of control signals from the controller including a puncturing stage control signal;

first and a second storing means for storing one of a current state metric and a next state metric in response to the write enable signal, and reading out the previous state metric stored therein in response to the access control signal;

first selection means for outputting one of the current state metric and the next state metric to the storing means in response to the puncturing stage control signal;

register for storing the previous state metric outputted from the first selection means;

first add-compare-select calculating means for adding, comparing, and selecting the branch metrics and the previous state metric from the register, and generating the current state metric and current path selection information;

second add-compare-select calculating means for adding, comparing, and selecting the next branch metric and the current state metric from the first add-compare-select calculating means, and generating the next state metric and next path selection information;

second selection means for outputting the previous state metric in response to the selection signal;

a traceback unit for tracing the current and the next path selection information from the first and the second add-compare-select calculating means, respectively, to find a maximum likelihood path from which the convolutional data was received, and outputting decoded data; and a controller for generating a plurality of decoding control signals to the branch metric unit, the first and the second add-compare-select calculating means, the add-compare-select control means, and the traceback unit.

10. The viterbi decoder according to claim 9, wherein said first add-compare-select calculating means comprises:

a first add-compare-select calculating circuit for performing addition, comparison, and selection functions so as to generate the current state metrics and the current path selection information;

a register for storing the current state metric; and a delay for delaying the current state metric a predetermined time and then supplying the current state metric to the second selection means.

11. The viterbi decoder according to claim 9, wherein said second add-compares elect calculating means comprises:

a second add-compare-select calculating circuit for performing addition, comparison, and selection functions so as to generate the next state metric and the next path selection information;

a register for storing the next state metric; and a delay for delaying the next state metric a predetermined time and then supplying the next state metric to the second selection means.

12. The viterbi decoder according to claim 9, wherein said second add-compare-select calculating means generates the current state metric and the current path selection information, when the convolutional data is non punctured data, and generates the next state metric and the next path selection information, when the convolutional data is punctured data.

13. The viterbi decoder according to claim 9, wherein said second add-compare-select calculating means generates the current state metric and the current path selection information or the next state metric and the next path selection information, in response to the puncturing stage control signal from the controller.

14. The viterbi decoder according to claim 9, wherein the current and next path selection information comprise a current survival path and a next survival path, respectively.

15. The viterbi decoder according to claim 9, wherein the current state metric and the next state metric are calculated approximately simultaneously.

* * * * *